United States Patent

Klein et al.

[11] Patent Number: 5,930,659
[45] Date of Patent: Jul. 27, 1999

[54] FORMING MINIMAL SIZE SPACES IN INTEGRATED CIRCUIT CONDUCTIVE LINES

[75] Inventors: Richard K. Klein, Mountain View; Asim A. Selcuk, Cupertino; Nicholas J. Kepler, San Jose; Christopher A. Spence; Raymond T. Lee, both of Sunnyvale; John C. Holst, San Jose, all of Calif.; Stephen C. Horne, Austin, Tex.

[73] Assignee: Advanced MicroDevices, Inc., Sunnyvale, Calif.

[21] Appl. No.: 08/986,098

[22] Filed: Dec. 5, 1997

[51] Int. Cl.⁶ .................. H01L 21/3205; H01L 21/324
[52] U.S. Cl. .................... 438/491; 438/532; 438/635
[58] Field of Search .................. 438/533, 532, 438/438, 635, 637, 659, 657, 491

[56] References Cited

U.S. PATENT DOCUMENTS

| | | | |
|---|---|---|---|
| 4,084,986 | 4/1978 | Aoki et al. | 438/372 |
| 4,280,854 | 7/1981 | Shibata et al. | 438/532 |
| 4,601,778 | 7/1986 | Robb | 438/491 |
| 5,270,236 | 12/1993 | Rosner | 438/637 |
| 5,677,242 | 10/1997 | Aisou | 438/637 |

*Primary Examiner*—Olik Chaudhuri
*Assistant Examiner*—Anh D. Mai
*Attorney, Agent, or Firm*—Foley & Lardner

[57] ABSTRACT

A method of forming minimal gaps or spaces in a polysilicon conductive lines pattern for increasing the density of integrated circuits by converting an area of the size of the desired gap or space in the polysilicon to silicon oxide, followed by removing the silicon oxide. The preferred method is to selectively ion implant oxygen into the polysilicon and annealing to convert the oxygen implanted polysilicon to silicon oxide. As an alternative method, an opening in an insulating layer overlying the conductive line is first formed by conventional optical lithography, followed by forming sidewalls in the opening to create a reduced opening and using the sidewalls as a mask to blanket implant oxygen through the reduced opening and into the exposed polysilicon conductive line. After annealing, the implanted polysilicon converted to silicon oxide and removed to form a gap or space in the polysilicon conductive line pattern substantially equal in size to the reduced opening. Instead of blanket implanting with oxygen, thermal oxidation can be used to convert the exposed polysilicon to silicon oxide.

12 Claims, 3 Drawing Sheets

FORMING MINIMAL SIZE SPACES IN INTEGRATED CIRCUIT CONDUCTIVE LINES

CROSS REFERENCE TO RELATED APPLICATION

This application is related to U.S. patent application Ser. No. 08/986,179, entitled "Forming Minimal Size Spaces in Integrated Circuit Conductive Lines", filed on an even date herewith.

FIELD OF THE INVENTION

The present invention relates to fabricating integrated circuits and, more specifically, to fabricating polysilicon conductive line levels of integrated circuits with minimal size spaces.

BACKGROUND OF THE INVENTION

With the demand for higher levels of integration of semiconductor chips, such as silicon semiconductor chips, and the need for greater density in these circuits, the conductive line dimensions and spaces between the conductive lines of the integrated circuits become more and more critical. This is specially the case with a microprocessor integrated circuit chip of which a large portion of the real estate of the chip is an SRAM. For increased performance of future microprocessor, the storage capacity of the SRAM must increase thereby requiring a larger portion of real estate of the microprocessor.

A limit on the dimensions in the integrated circuits is the resolution of the optical lithographic system used in the fabrication of the integrated circuit including the metallization levels. Today, with deep ultra violet photolithography, the resolution limit is about 0.25 microns. To break through this barrier, semiconductor manufactures are resorting to techniques like phase shift lithography, which require expensive masks but permit optical lithography to achieve these small line widths, and X-ray lithography which is extremely costly from an exposure equipment and mask making standpoint.

In addition, exposure with optical lithography creates diffraction effects which prevents defining the ends of conductive lines with the necessary degree of precision or accuracy. Therefore, the design rules in fabricating the ends of conductive lines and other features of the lines are purposely loosely established in the design due to this diffraction problem.

SUMMARY OF THE INVENTION

Accordingly, it is an object of the present invention to provide a method of fabricating an integrated circuit with minimal line widths and spaces or gaps between the lines.

Another object of present invention is to provide an integrated circuit fabrication method in which the gaps or spaces between conductive lines can be fabricated without resort to optical lithography.

An additional object of the present invention is to provide an integrated circuit fabrication method in which the gaps or spaces between conductive lines can be further reduced after being first defined by optical lithography.

A further object of the present invention is to provide a fabrication method of an integrated circuit which uses conventional semiconductor manufacturing apparatus.

In accordance with the present invention, a semiconductor material, such as a silicon substrate, is formed with a conductive line pattern, such as polysilicon, using conventional optical lithography. To form a gap or space in the conductive line pattern, oxygen is selectively implanted into the area of the conductive line in which a gap or spaced is required. The oxygen implanted area upon annealing converts the polysilicon to silicon oxide which can be left as insulating spacer or, preferably, can be then removed, thereby leaving a gap or space in the polysilicon conductive line. An alternative method for forming a gap or space in the conductive line pattern is to preferably form a protective layer, such as silicon nitride, on the conductive line pattern followed by forming an insulating layer, such as silicon oxide, on the optional etch protective layer. Using conventional optical lithography and etching, a pattern opening is formed in the insulating layer and etch protective layer, preferably by exposure and development of an optical resist and anisotropic dry etching. With the opening formed in the insulating and etch protection layer, a conformal layer is deposited on insulating layer and on the walls of the insulating and etch protective layers in the opening. The conformal layer is anisotropically etched to create sidewalls in the opening with the reduced opening between the sidewalls being the desired gap or space in the conductive line. With the sidewalls serving as a mask, the exposed polysilicon in the reduced opening is blanket implanted with oxygen to convert upon annealing the polysilicon to silicon oxide. Alternatively, the exposed polysilicon is thermally oxidized to silicon oxide. After forming the localized silicon oxide, the silicon oxide is removed to leave a gap or space in the conductive line pattern. The gap or space formed in the conductive line pattern is two sidewall widths less in dimension than the original lithographic formed opening, thereby achieving a gap or space less than the resolution of the optical lithography.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS OF THE INVENTION

Figure 1A:
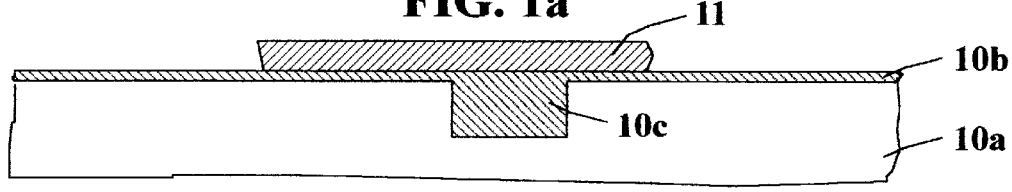
FIG. 1a is a cross-sectional view of a portion of a polysilicon conductive line pattern disposed on a semiconductor substrate with an insulating layer and field oxide isolation, which is the first of five figures relative to the preferred method of the present invention.
Figure 1B:
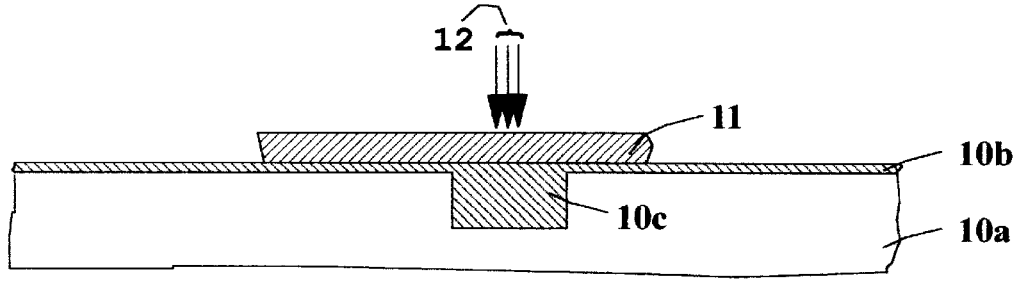
FIG. 1b is a cross-sectional view of the portion of conductive line pattern of FIG. 1a with oxygen ions being selectively implanted into the polysilicon.
Figure 1C:
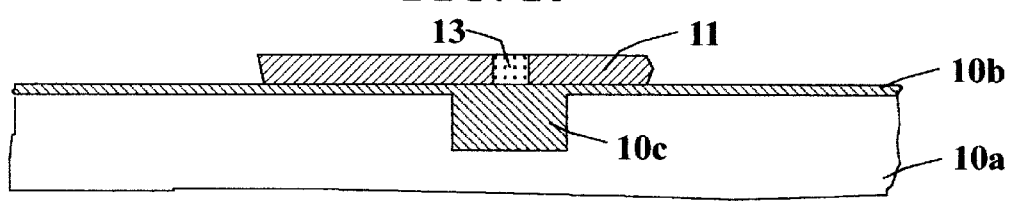
FIG. 1c is a cross-sectional view of the portion of the conductive line pattern of FIG. 1 b with the oxygen ions in the implanted area of the polysilicon prior to conversion of the polysilicon to silicon oxide.
Figure 1D:
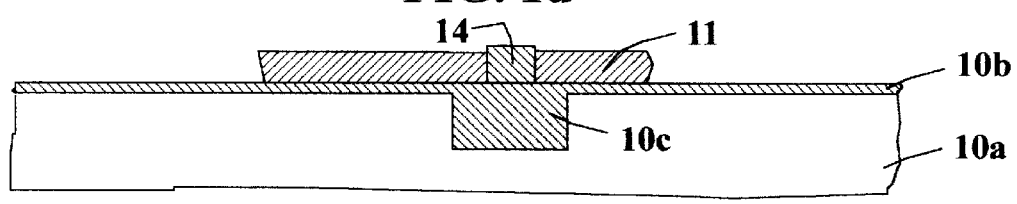
FIG. 1d is a cross-sectional view of the portion of the conductive line pattern of FIG. 1c with polysilicon converted to silicon oxide in the area of implantation.
Figure 1E:
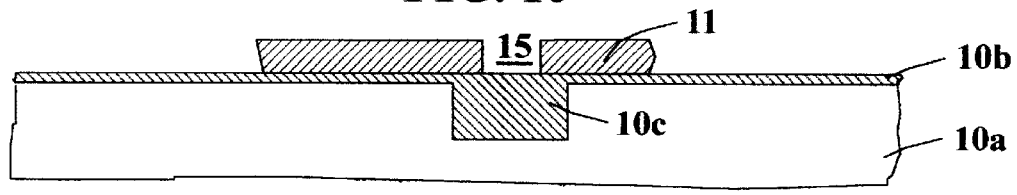
FIG. 1e is a cross-sectional view of the portion of the conductive line pattern of FIG. 1c with the silicon oxide removed to create a gap or space in the polysilicon conductive line pattern.

Referring now to the drawings and starting with the preferred embodiment of FIGS. 1a–1e, which shows a cross-sectional view of a semiconductor substrate 10a with an insulating layer 10b and field oxide isolation 10c of conductive line pattern 11, herein polysilicon doped with an impurity, such as arsenic or boron depending on the type of transistor with which the conductive line is associated as shown in FIG. 1a. Intermediate layers (not shown) may be present between the surface of the semiconductor substrate 10a and the conductive line 11. To form a minimal gap or space in the conductive line pattern, the conductive line is selectively ion implanted with oxygen ions as represented by the arrows 12 of FIG. 1b. The conditions of the implant are $2\times10^{17}$ O$^+$ions/cm$^2$. Before annealing to cause a reaction between the implanted oxygen ions and the silicon atoms of the polysilicon, the implanted oxygen is depicted as area 13 as shown in FIG. 1c. Upon annealing at a temperature in the range of about 750° C. to about 900° C. for a time in the range of about 10 minutes to about 20 minutes the oxygen implanted polysilicon is converted to silicon oxide. However, lower temperatures and times can be used if the silicon oxide is removed to form the gap or space and not remain as an insulating space. If the silicon oxide is to be removed, then only the etch selectivity of the silicon oxide is critical and not its insulation or dielectric quality. Preferably, the annealing is at about 800° C. for about 15 minutes. This converts the implanted area of the polysilicon conductive line 11 into a silicon oxide area 14 as shown in FIG. 1d which has a different etch selectivity than the polysilicon. It will be noted in FIG. 1d that the volume of silicon oxide 14 is greater than the implanted area and the gap 15 is larger than the implanted area as shown in FIG. 1e, which will be discussed subsequently. By removing the silicon oxide by conventional techniques, such as preferably by an aqueous solution of hydrogen fluoride, a gap or space 15 is created in the conductive line pattern. Alternatively, the silicon oxide area 14 can be removed by anisotropically etching with a gas more selective for silicon oxide and polysilicon, such as carbon tetrafluoride with hydrogen ($CF_4/H_2$). Carbon hexafluoride ($C_2F_6$) also can be used to remove the silicon oxide without etching polysilicon. Conventional etchers, such as a parallel plate reactive ion etcher (RIE), are suitable for anisotropic etching the silicon oxide. Another suitable plasma reactor for etching the silicon oxide is an electron cyclotron resonance (ECR) plasma reactor. Since optical lithography was not used in forming the gap or space, no diffraction problems are present in this method and the size of the gap or space that can be achieve is less than the resolution limits of optical lithography.

Turning now to a general description of the alternative embodiment of the present invention, an insulating layer, herein silicon oxide is formed or deposited on the conductive line pattern. An opening is formed in the insulating layer by conventional optical lithography with a resist pattern defining the opening. A layer of conformal material, herein TEOS, is deposited on the insulating layer and in the opening. The conformed layer is anisotropically etched to remove the conformal material on the surface of the insulating layer and at the bottom of the opening, leaving sidewalls in the opening. These sidewalls define a reduced opening and serve as a mask for either blanket ion implanting oxygen ions ($O^+$) or thermally oxidizing the exposed polysilicon in the reduced opening. After annealing with blanket implantation similar to the preferred embodiment, or without annealing with the thermal oxidization step, the exposed polysilicon is converted into silicon oxide. The ion implanting of oxygen ions is preferred because the expansion of implanted area after conversion to silicon oxide is only about 16% more that the area whereas the expansion with thermal oxidation is about 44% more than the masked area. In addition, the annealing temperature is lower and the time is shorter than for thermal oxidation. To form a gap or space in the conductive line pattern, the silicon oxide is removed in the same manner as the preferred embodiment. With the insulating material and sidewalls removed, the gap or space of the conductive line pattern is only slightly longer than the size of what had been the reduced opening.

Figure 2A:
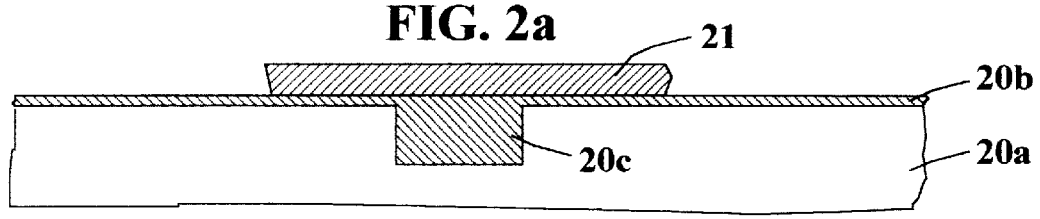
FIG. 2a is a cross-sectional view of the portion of the conductive line pattern on a semiconductor substrate with an insulating layer and field oxide isolation, which is the first of nine figures of an alternative method of the present invention.
Figure 2B:
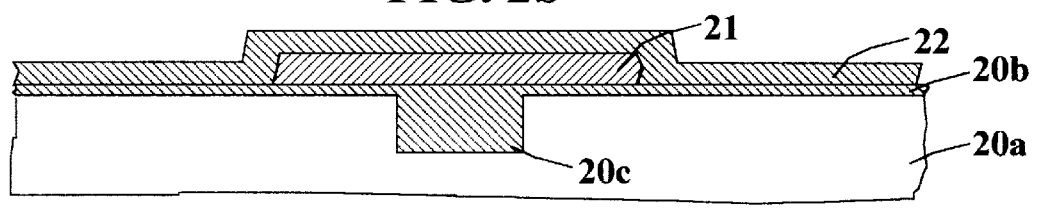
FIG. 2b is a cross-sectional view of the portion of the conductive line pattern of FIG. 2a with an optional etch protective layer thereon.
Figure 2C:
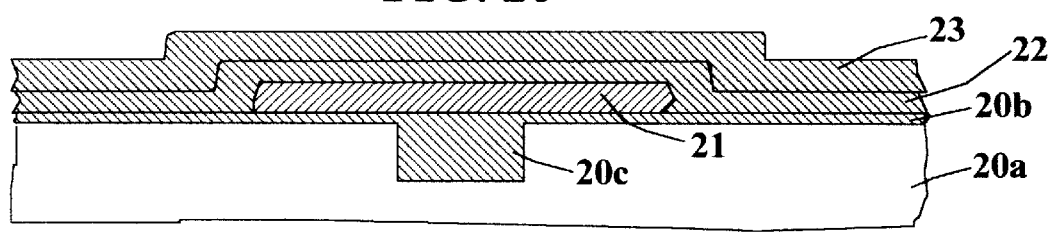
FIG. 2c is a cross-sectional view of the portion of the conductive line pattern of FIG. 2b with an insulating layer on the optional etch protective layer.
Figure 2D:
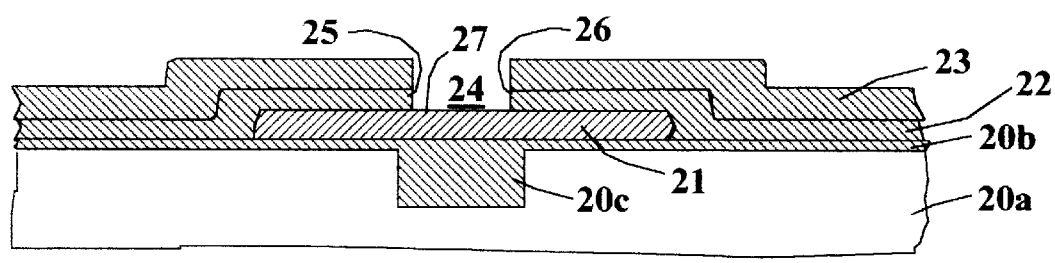
FIG. 2d is a cross-sectional view of the portion of the conductive line pattern of FIG. 2c with opening in the insulating layer and etch protective layer formed by conventional optical lithography.
Figure 2E:
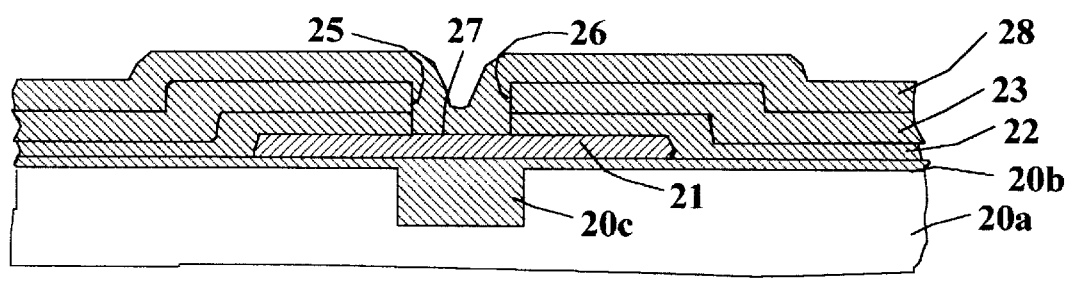
FIG. 2e is a cross-sectional view of the portion of the conductive line pattern of FIG. 2d with the opening filled with a conformal material.
Figure 2F:
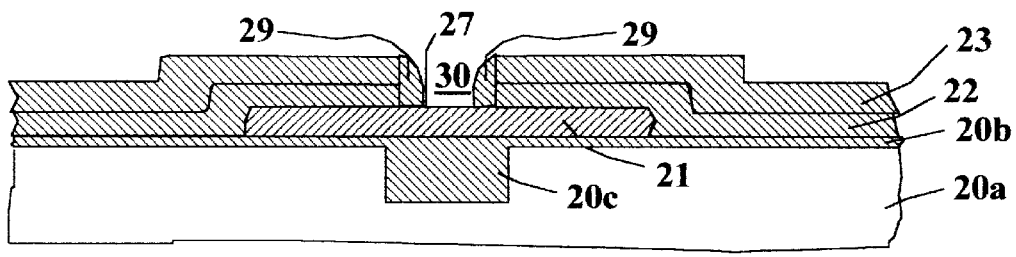
FIG. 2f is a cross-sectional view of the portion of the conductive line pattern of FIG. 2e with the conformal material anisotropically etched to form sidewalls in the opening and a reduced opening between the sidewalls.
Figure 2G:
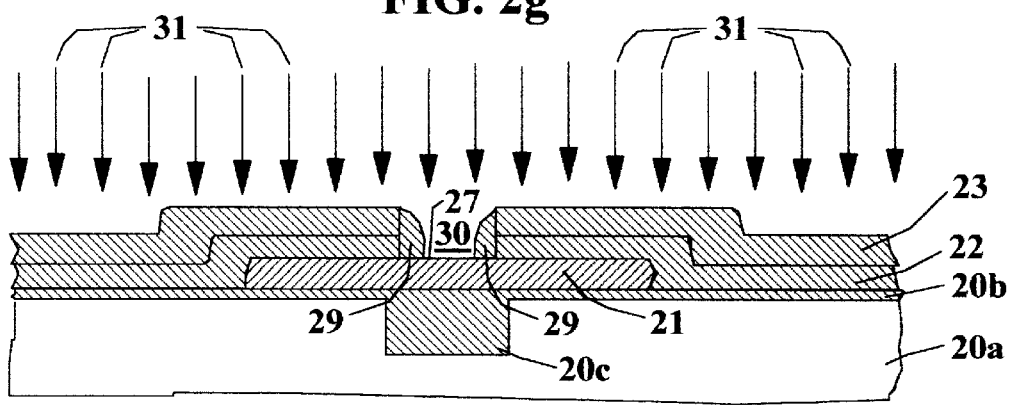
FIG. 2g is a cross-sectional view of the portion of the conductive line pattern of FIG. 2f with a blanket ion implantation of oxygen into the exposed polysilicon conductive line in the reduced opening.
Figure 2H:
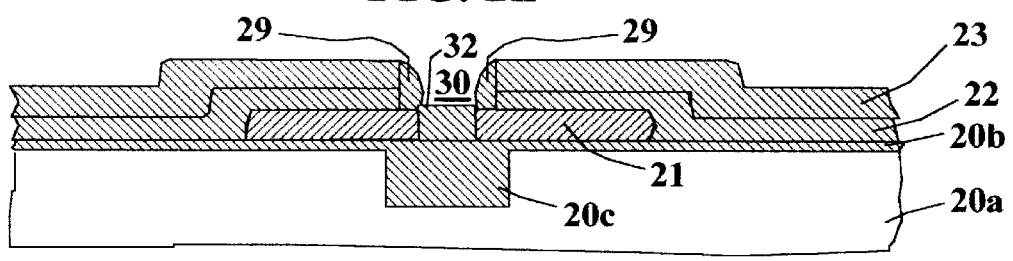
FIG. 2h is a cross-sectional view of the portion of the conductive line pattern of FIG. 2g with the ion implanted area of the polysilicon conductive line converted to silicon oxide.
Figure 2I:
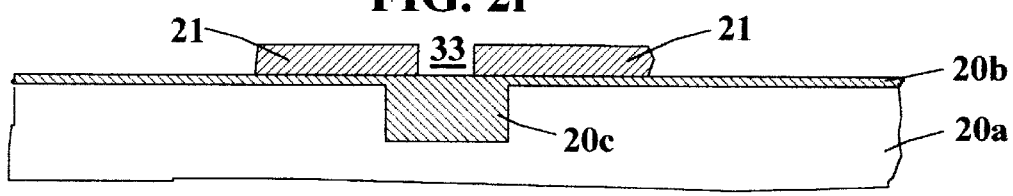
FIG. 2i is a cross-sectional view of the portion of conductive line pattern of FIG. 2i with a gap or space formed in the conductive line of the size of the reduced opening between the sidewalls and with the insulating layer, etch protective layer and sidewalls removed.

Turning now to FIGS. 2a–2i and a more detailed description of this alternative embodiment of the present invention, FIG. 2a shows a portion of a semiconductor substrate 20c, herein monocrystalline silicon with an insulating layer 20b and field oxide isolation 20a and having a conductive line 21 disposed thereon. Intermediate layers (not shown) may be present between the surface of the semiconductor substrate 20a and the conductive line 21. The material of the conductive line 21 is polysilicon doped with an impurity to render it conductive, such as boron or arsenic. As a preferred step for protecting the surfaces such as the field oxide isolation 20c, underlying the conductive line 21 from subsequent etching, an etch protective layer 22, herein silicon nitride, as shown in FIG. 2b, is formed on silicon surface and the conductive line pattern by chemical vapor deposition in the present instance. Other known methods, such as sputtering, may be used to form this layer 22. Next, an insulating layer 23, herein silicon oxide, which is shown in FIG. 2c as conformal, but layer 23 also can by non-conformal deposition, such as by chemical vapor deposition of silane ($SiH_4$) and oxygen. Another suitable material for the insulating layer 23 is fluorinated silicon oxide ($SiO_xF_y$). The conformal deposition is performed by using tetraethylorthosilicate (TEOS) or tetramethylcyclosilonane (TMCTS). As shown in FIG. 2d, an opening 24 is formed with walls 25 and 26 in the etch protective layer 22 and the insulating layer 23 respectively, by using a conventional resist and optical lithographic exposure and development and, preferably, followed by anisotropic dry etching. The gas mixtures used in etching are more selective for the layers 22 and 23 than the conductive line 21 and herein, are carbon tetrafluoride with hydrogen ($CF_4/H_2$). Carbon hexafluoride ($C_2F_6$) also can be used to etch both silicon oxide and silicon nitride without etching polysilicon. Conventional etchers, such as a parallel plate reactive ion etcher (RIE), is suitable for forming the opening. Another suitable plasma reactor is an electron cyclotron resonance (ECR) plasma reactor. After the opening 24 is formed and extends to the upper surface 27 of the conductive line, a conformal material 28 is deposited on the insulating layer 23 and in the opening 24. Herein the conformal material is silicon oxide deposited from TEOS, but the conformal material may also be TMCTS. Since the material 28 is conformal, it deposition is essentially uniform on the top of the insulation layer 23, the sides of the walls 25 and 26, and on the surface 27 of the conductive line 21 as shown in FIG. 2e. Again, anisotropic etching is used remove the conformal material 28 from the top of the insulating layer 23 and the bottom of opening 24 to the surface 27 of the conductive line. The same two fluorine gases described for etching silicon oxide and silicon nitride can be used to etch. Because anisotropic etching is unidirectional, the vertical portion of the conformal material 28 is not etched and sidewalls 29 are formed in the opening 24 reducing the size of the opening as shown in FIG. 2f. The reduced opening (RO) 30 equals approximately or about the original opening 24 minus the width of two sidewalls 29. There is some expansion of the polysilicon when it converts to silicon oxide as shown in FIG. 2h so that the size is approximate. By using the sidewalls, which is one continuous sidewall around the periphery of the opening as a mask for blanket implanting oxygen as represented by the arrows 31 of FIG. 2g or, alternatively, thermally oxidizing the exposed polysilicon in the reduced opening 30 at a temperature of not greater than 900° C. for no longer than 30 minutes in steam. With high pressure oxidation, the temperature can be reduced to about 700° C. The conditions of the blanket implant are $2\times10^{17}$ $O^+$ions/$cm^2$. After annealing at a temperature in the range of about 750° C. to about 900° C. for a time in the range of about 10 minutes to about 20 minutes. Preferably, the annealing is at about 800° C. for about 15 minutes. This converts the implanted area of the polysilicon conductive line 21 into a silicon oxide area 32 as shown in FIG. 2h which can remain as an insulating spacers. Alternatively, the silicon oxide 32 by can be removed by conventional techniques, such as preferably by an aqueous solution of hydrogen fluoride to create a gap or space 33 in the conductive line pattern 21. Alternatively, the silicon oxide area 32 can be removed by anisotropically etching with a gas more selective for silicon oxide than polysilicon, such as carbon tetrafluoride with hydrogen ($CF_4/H_2$). Carbon hexafluoride ($C_2F_6$) also can be used to remove the silicon oxide without etching polysilicon. Conventional etchers, such as a parallel plate reactive ion etcher (RIE), is suitable for anisotropic etching the silicon oxide. Another suitable plasma reactor for etching the silicon oxide is an electron cyclotron resonance (ECR) plasma reactor. Since optical lithography was not used in forming the gap or space, no diffraction problems are present in this method and the size of the gap or space that can be achieve is less than the resolution limits of optical lithography.

The major advantage that can be taken from the methods of the present invention in reducing the dimension of gaps or spaces in conductive line patterns is a greater density in integrated circuits, especially microprocessor integrated circuits with larger internal SRAMs. Also in the preferred method, the diffraction problems of optical lithography are eliminated. Further, such increased density is achieved with conventional semiconductor manufacturing tools. Thus, dimensions smaller that the resolution limits of optical lithography while still using optical lithography as one of the manufacturing tools in the method of the present invention.

Although this invention has been described relative to specific materials, and apparatuses for depositing and etching these materials, it is not limited to the specific materials or apparatuses but only to their specific characteristics. Other materials and apparatus can be substituted for those described herein which will be well understood by those skilled in the microelectronics and semiconductor arts after appreciating the present invention.

Having thus described the invention, what is claimed is:

1. A method of fabricating a gap or space in a conductive line pattern comprising the steps of:

forming a polysilicon conductive line pattern disposed on a semiconductor substrate;

converting a portion of said polysilicon into silicon oxide;

using the silicon oxide portion to form an insulating space in the polysilicon line pattern; and removing said silicon oxide portion from the polysilicon line pattern.

2. The method of claim 1 wherein the polysilicon is converted into silicon oxide by selective implantation of oxygen into the polysilicon portion and annealing.

3. The method of claim 1 wherein the silicon oxide is removed by anisotropic etching with a gas which is more selective for silicon oxide than polysilicon.

4. A method of fabricating a gap or space in a conductive line pattern comprising the steps of:

forming a polysilicon conductive line pattern disposed on a semiconductor substrate;

converting a portion of said polysilicon into silicon oxide by directing a selective beam of oxygen ions into the polysilicon portion and annealing; and using the silicon oxide portion to form an insulating space in the polysilicon line pattern and removing said silicon oxide portion from the polysilicon line pattern.

5. A method of fabricating a gap or space in a conductive line pattern comprising the steps of:

forming a polysilicon conductive line pattern disposed on a semiconductor substrate having field isolation, said conductive line pattern being partially disposed on said field isolation;

forming an insulating layer on said conductive line pattern;

forming an opening in said insulating layer over said field isolation using optical lithography;

depositing a conformal layer on said insulating layer and in said opening;

forming sidewalls from the conformal layer in said opening with a reduced opening between the sidewalls to expose a portion of the polysilicon;

converting said exposed portion of said polysilicon into silicon oxide;

using the silicon oxide portion to form an insulating space over said field isolation in the polysilicon line pattern.

6. The method of claim 5 wherein the insulating layer is blanket implanted with oxygen to implant the exposed polysilicon with oxygen from the blanket implant through the reduced opening.

7. The method of claim 5 wherein the exposed polysilicon is thermally oxidized through the reduced opening.

8. The method of claim 5 wherein the reduced opening is about the width of the lithographic opening minus the width of two sidewalls.

9. The method of claim 8 wherein the width of the lithographic opening is at the limits of optical lithography.

10. The method of claim 5 wherein source for the conformal layer is TEOS.

11. The method of claim 5 wherein said silicon oxide portion is removed from the polysilicon line pattern.

12. The method of claim 11 wherein said silicon oxide portion of the polysilicon conductive line is removed at the same time as the insulating layer is removed.

* * * * *